US010614943B2

(12) United States Patent
Choi et al.

(10) Patent No.: US 10,614,943 B2
(45) Date of Patent: Apr. 7, 2020

(54) MULTILAYER SEED PATTERN INDUCTOR AND MANUFACTURING METHOD THEREOF

(71) Applicant: SAMSUNG ELECTRO-MECHANICS CO., LTD., Suwon-si, Gyeonggi-do (KR)

(72) Inventors: Woon Chul Choi, Suwon-si (KR); Myung Jun Park, Suwon-si (KR); Hye Min Bang, Suwon-si (KR); Jun Ah, Suwon-si (KR); Myung Sam Kang, Suwon-si (KR); Jung Hyuk Jung, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/051,110

(22) Filed: Feb. 23, 2016

(65) Prior Publication Data

US 2016/0336105 A1 Nov. 17, 2016

(30) Foreign Application Priority Data

May 11, 2015 (KR) ........................ 10-2015-0065320

(51) Int. Cl.
*H01F 5/00* (2006.01)
*H01L 27/08* (2006.01)
(Continued)

(52) U.S. Cl.
CPC ....... *H01F 17/0013* (2013.01); *H01F 27/255* (2013.01); *H01F 41/046* (2013.01)

(58) Field of Classification Search
CPC ............ H01F 27/2804; H01F 17/0013; H01F 17/0006; H01F 27/292; H01L 28/10; H01L 23/5227; H01L 23/645; H01L 2914/1206
(Continued)

(56) References Cited

U.S. PATENT DOCUMENTS 5,059,278 A * 10/1991 Cohen ....................... C23F 1/44 216/108
6,008,102 A * 12/1999 Alford ................ H01L 23/5227 257/531
(Continued)

FOREIGN PATENT DOCUMENTS

CN 1258777 C 6/2006
CN 103366920 A 10/2013
(Continued)

OTHER PUBLICATIONS

US 9,978,509 B2, 05/2018, Yoon (withdrawn)*
(Continued)

*Primary Examiner* — Elvin G Enad
*Assistant Examiner* — Joselito Baisa
(74) *Attorney, Agent, or Firm* — Morgan, Lewis & Bockius LLP

(57) ABSTRACT

A multilayer seed pattern inductor includes a magnetic body and an internal coil part. The magnetic body contains a magnetic material. The internal coil part is embedded in the magnetic body and includes connected coil conductors disposed on two opposing surfaces of an insulating substrate. Each of the coil conductors includes a seed pattern formed of at least two layers, a surface coating layer covering the seed pattern, and an upper plating layer formed on an upper surface of the surface coating layer.

22 Claims, 7 Drawing Sheets

'A'

(51) Int. Cl.
*H01F 17/00* (2006.01)
*H01F 27/255* (2006.01)
*H01F 41/04* (2006.01)

(58) Field of Classification Search
USPC .......................... 336/200; 257/531; 29/602.1
See application file for complete search history.

(56) References Cited

U.S. PATENT DOCUMENTS 6,114,925 A * 9/2000 Lo .......................... H01P 1/203 333/185
6,495,019 B1 * 12/2002 Filas .................... H01F 41/046 205/119
6,560,864 B1 * 5/2003 Chang ................ H01F 17/0006 29/604
6,809,436 B2 * 10/2004 Chang ..................... H02K 3/26 310/309
7,023,299 B2 * 4/2006 Shoji ...................... H03H 7/427 333/181
7,176,773 B2 2/2007 Shoji
7,480,980 B2 * 1/2009 Jung .................. H01F 17/0006 29/602.1
7,631,418 B2 * 12/2009 Han ........................ G11B 5/33 205/135
7,751,146 B2 * 7/2010 Han ........................ G11B 5/33 360/122
8,601,673 B2 * 12/2013 Tseng .................... H01F 41/046 29/606
8,717,136 B2 * 5/2014 Fontana, Jr. .......... H01F 41/042 336/199
9,697,855 B1 * 7/2017 Liu ...................... G11B 5/1278
9,911,530 B2 * 3/2018 Yang ................... H01F 27/2804
9,945,042 B2 * 4/2018 Cha ........................ C25D 7/001
10,388,447 B2 * 8/2019 Choi ..................... H01F 41/046
2003/0088970 A1 * 5/2003 Chang ................ H01F 17/0006 29/603.07
2003/0151849 A1 * 8/2003 Sasaki ..................... G11B 5/17 360/123.28
2004/0164835 A1 8/2004 Shoji
2004/0189106 A1 * 9/2004 Chang ...................... H02K 3/26 310/40 MM
2005/0157432 A1 * 7/2005 Hsiao ................... G11B 5/3133 360/321
2005/0243465 A1 * 11/2005 Lille .................... G11B 5/3163 360/123.24
2006/0091103 A1 * 5/2006 Tsang ..................... G11B 5/313 216/22
2007/0247268 A1 * 10/2007 Oya .................... H01F 17/0006 336/200
2010/0259353 A1 10/2010 Saito et al.
2013/0241684 A1 * 9/2013 Yang .................. H01F 17/0013 336/200
2013/0249664 A1 9/2013 Tonoyama et al.
2015/0035640 A1 2/2015 Wang et al.
2015/0091688 A1 * 4/2015 Jung ................... H01F 17/0006 336/200
2015/0255208 A1 * 9/2015 Kim .................... H01F 17/0006 336/200
2015/0270053 A1 * 9/2015 Cha ........................ C25D 7/001 336/192
2015/0340149 A1 * 11/2015 Lee ........................ H05K 1/181 174/260
2016/0163444 A1 * 6/2016 Choi ................... H01F 17/0013 336/200
2019/0013141 A1 * 1/2019 Yoon .................. H01F 17/0006
2019/0035528 A1 * 1/2019 Choi ..................... H01F 27/292

FOREIGN PATENT DOCUMENTS

| | | | |
|---|---|---|---|
| CN | 103695972 | A | 4/2014 |
| CN | 104347262 | A | 2/2015 |
| JP | 10-241983 | A | 9/1998 |
| JP | 2001-267166 | A | 9/2001 |
| JP | 2002-280219 | A | 9/2002 |
| JP | 2004-253684 | A | 9/2004 |
| JP | 2004-319570 | A | 11/2004 |
| JP | 2005-109097 | A | 4/2005 |
| JP | 2006-278479 | A | 10/2006 |
| JP | 2014-080674 | A | 5/2014 |
| KR | 10-2010-0113029 | A | 10/2010 |

OTHER PUBLICATIONS

Japanese Office Action dated Jan. 31, 2017, issued inJapanese Patent Application No. 2016-065414. (w/ English translation).
First Office Action issued in Chinese Patent Application No. 201610136015.X, dated Jul. 28, 2017 (With English Abstract).
Chinese Office Action issued in corresponding Chinese Patent Application No. 201610136015.X, dated Mar. 7, 2018, with English Translation.

* cited by examiner

MULTILAYER SEED PATTERN INDUCTOR AND MANUFACTURING METHOD THEREOF

CROSS-REFERENCE TO RELATED APPLICATION

This application claims the priority and benefit of Korean Patent Application No. 10-2015-0065320 filed on May 11, 2015, with the Korean Intellectual Property Office, the disclosure of which is incorporated herein by reference.

BACKGROUND

The present disclosure relates to a multilayer seed pattern inductor and a manufacturing method thereof.

An inductor, an electronic component, is a representative passive element that is commonly used in electronic circuits together with a resistor and a capacitor to remove noise.

A thin film type inductor can be manufactured by forming an internal coil part by plating, forming a magnetic body by curing a magnetic powder-resin composite obtained by mixing magnetic powder and a resin with each other, and then forming external electrodes on external surfaces of the magnetic body.

SUMMARY

An aspect of the present disclosure may provide a multilayer seed pattern inductor in which direct current resistance (Rdc) is decreased by increasing a cross-sectional area of an internal coil part, and a manufacturing method thereof.

According to an aspect of the present disclosure, a multilayer seed pattern inductor may include an internal coil part embedded in a magnetic body and including connected coil conductors disposed on two opposing surfaces of an insulating substrate. Each of the coil conductors may include a seed pattern including at least two layers, a surface coating layer covering the seed pattern, and an upper plating layer formed on an upper surface of the surface coating layer.

According to another aspect of the present disclosure, a method of manufacturing a multilayer seed pattern inductor may include forming coil conductors on two opposing surfaces of an insulating substrate to form an internal coil part, and stacking magnetic sheets on upper and lower surfaces of the internal coil part to form a magnetic body. The forming of the coil conductors can include forming a seed pattern including at least two layers on the insulating substrate, forming a surface coating layer covering the seed pattern, and forming an upper plating layer on an upper surface of the surface coating layer.

According to a further aspect of the present disclosure, a method of forming a multilayer coil inductor may include forming a seed pattern having a spiral shape on an insulating substrate, forming a surface coating layer covering the seed pattern, and forming an upper plating layer on an upper surface of the surface coating layer. The forming of the seed pattern may include forming a first plating resist on the insulating substrate, forming an opening in the first plating resist by exposure and development, forming a first seed pattern including a conductive metal in the opening in the first plating resist by plating, forming a second plating resist on the first plating resist and the first seed pattern, forming an opening in the second plating resist through exposure and development to expose the first seed pattern, forming a second seed pattern including the conductive metal in the opening in the second plating resist by plating, and removing the first and second plating resists.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
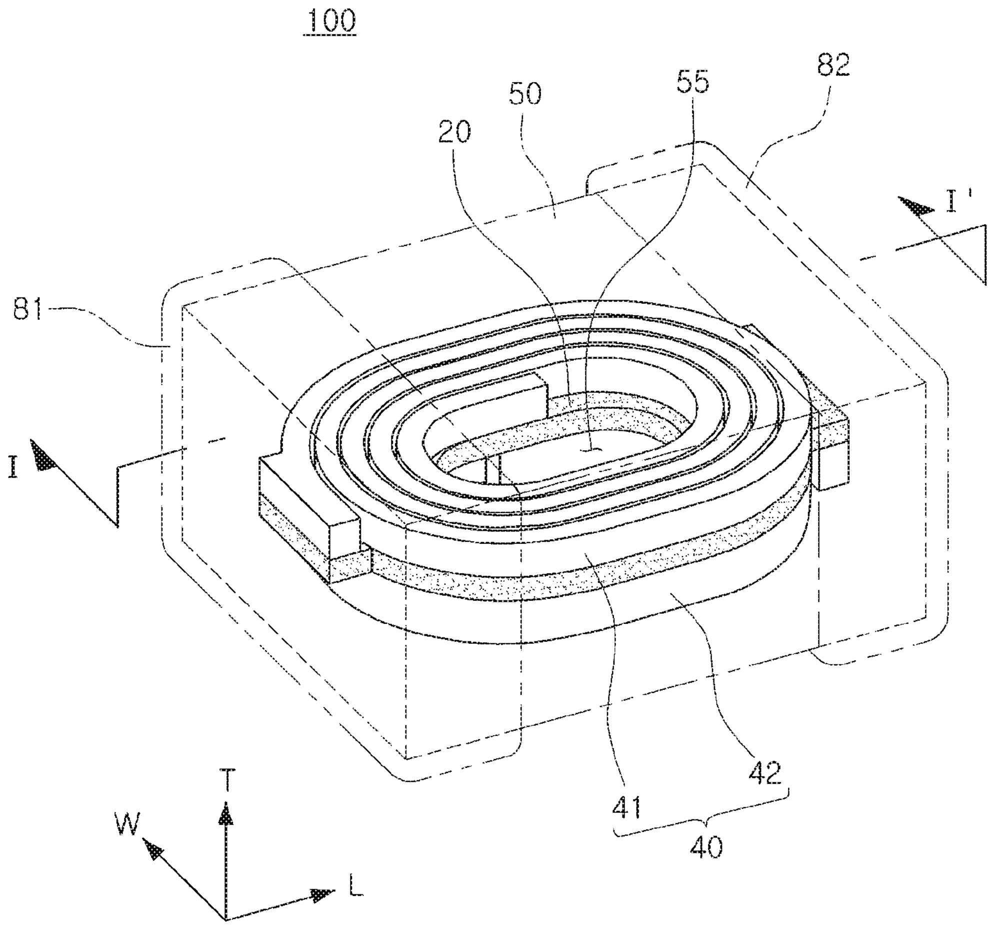
FIG. 1 is a schematic perspective view illustrating a multilayer seed pattern inductor according to an exemplary embodiment.

Hereinafter, embodiments of the present inventive concepts will be described with reference to the attached drawings.

The present inventive concepts may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's position-based relationship to another element (s) as shown in the figures. It will be understood that the spatially relative terms are based on the particular orientations shown in the figures, and are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concepts will be described with reference to schematic views illustrating exemplary embodiments. However, due to manufacturing techniques and/or tolerances, actual manufactured embodiments may differ slightly from the illustrated embodiments. Thus, embodiments of the present inventive concepts should not be construed as being limited to the particular shapes of regions shown herein but should be interpreted as including, for example, a change in shape resulting from the manufacturing processes. The following embodiments may also be constituted by one or a combination thereof.

Multilayer Seed Pattern Inductor

FIG. 1 is a schematic perspective view illustrating a multilayer seed pattern inductor according to an exemplary embodiment in the present disclosure. A body of the multilayer seed pattern inductor is illustratively shown as being transparent so that an internal coil part is visible.

Referring to FIG. 1, a thin film type inductor used in a power line of a power supply circuit is disclosed as an example of a multilayer seed pattern inductor 100.

The multilayer seed pattern inductor 100 according to the exemplary embodiment may include a magnetic body 50, an internal coil part 40 embedded in the magnetic body 50, and first and second external electrodes 81 and 82 disposed on external surfaces of the magnetic body 50 to thereby be electrically connected to respective ends of the internal coil part 40.

In the multilayer seed pattern inductor 100 according to the exemplary embodiment, a 'length' direction refers to an 'L' direction of FIG. 1, a 'width' direction refers to a 'W' direction of FIG. 1, and a 'thickness' direction refers to a 'T' direction of FIG. 1.

The magnetic body 50 may form at least a portion of an exterior of the multilayer seed pattern inductor 100 and may be formed of any material that exhibits magnetic properties. For example, the magnetic body 50 may be formed of ferrite and/or a magnetic metal powder, or of a material including ferrite and/or the magnetic metal powder.

The ferrite may be, for example, an Mn—Zn based ferrite, an Ni—Zn based ferrite, an Ni—Zn—Cu based ferrite, an Mn—Mg based ferrite, a Ba based ferrite, an Li based ferrite, or the like.

The magnetic metal powder may contain any one or more selected from the group consisting of Fe, Si, Cr, Al, and Ni. For example, the magnetic metal powder may contain a Fe—Si—B—Cr-based amorphous metal, but is not limited thereto.

The magnetic metal powder may have a particle diameter of 0.1 μm to 30 μm and be dispersed in a thermosetting resin such as an epoxy resin, polyimide, or the like. In such examples, the magnetic body 50 may be formed of the magnetic metal powder and the thermosetting resin that the powder is dispersed in.

The internal coil part 40 disposed in the magnetic body 50 may be formed by connecting a first coil inductor 41 formed on one surface of an insulating substrate 20 to a second coil conductor 42 formed on the other surface of the insulating substrate 20 that is opposite the one surface.

The first and second coil conductors 41 and 42 may be formed by an electroplating method. However, a formation method of the first and second coil conductors 41 and 42 is not limited thereto.

The first and second coil conductors 41 and 42 may be covered with an insulating film (not illustrated) to thereby not directly contact or electrically contact a magnetic material forming the magnetic body 50.

The insulating substrate 20 may be, for example, a polypropylene glycol (PPG) substrate, a ferrite substrate, a metal based soft magnetic substrate, or the like.

A central portion of the insulating substrate 20 may be penetrated by a through-hole, and the through-hole may be filled with the same magnetic material as the magnetic body 50, thereby forming a core part 55. As the core part 55 filled with the magnetic material is formed, inductance (Ls) of the multilayer seed pattern inductor 100 may be improved.

Each of the first and second coil conductors 41 and 42 may be in a form of a planar coil formed on the same plane of the insulating substrate 20. Each of the first and second coil conductors 41 and 42 may have hole at the center of the coil, and the hole may have substantially the same size as the through-hole penetrating through the insulating substrate 20.

The first and second coil conductors 41 and 42 may have a spiral shape, and the first and second coil conductors 41 and 42 formed on one surface and the other surface of the insulating substrate 20, respectively, may be electrically connected to each other by a via (not illustrated) penetrating through the insulating substrate 20. In one example, the first and second coil conductors 41 and 42 are electrically connected in series by the via.

The first and second coil conductors 41 and 42 and the via may contain or be formed of a metal having excellent electrical conductivity. For example, the first and second coil conductors 41 and 42 and the via may be formed of silver (Ag), palladium (Pd), aluminum (Al), nickel (Ni), titanium (Ti), gold (Au), copper (Cu), platinum (Pt), or an alloy thereof, or the like.

As a cross-sectional area of a coil conductors (e.g., 41 and 42) forming an internal coil part is increased, direct current resistance (Rdc), a main characteristic of inductors, is decreased. In addition, as an area of a magnetic material through which magnetic fluxes pass is increased (e.g., a cross-sectional area of the magnetic material taken along a plane perpendicular to the direction of flow of the magnetic flux), inductance of the inductor is increased.

Therefore, in order to decrease direct current resistance (Rdc) and increase inductance of the multilayer seed pattern inductor 100, the cross-sectional area of the coil conductor may be increased by forming the internal coil part and increasing a volume of the magnetic material.

In order to increase the cross-sectional area of the coil conductor, a width of a coil can be increased and/or a thickness of the coil can be increased.

However, by increasing the width of the coil, the risk of the coil failing due to short-circuits between adjacent windings of the coil may be significantly increased. Further, there may be practical limitations on a number of coil turns or windings that can be formed in the inductor, and the increase in the number of turns or windings may decrease a volume of the magnetic material at the center of the coil. Thus, efficiency of the coil component may be decreased, and the constraints outlined above may effectively impose limitations on implementing a high inductance product.

To address the above limitations, a coil conductor can be used that has a high aspect ratio (AR) obtained by increasing the thickness of the coil rather than increasing the width of the coil.

The aspect ratio (AR) of the coil conductor is a value obtained by dividing the thickness of the coil by the width of the coil. As the thickness of the coil is increased to be greater than the width of the coil, the aspect ratio (AR) of the coil may also be increased.

In embodiments in which the coil conductor is formed using a pattern plating method of patterning and plating a plating resist using an exposure and development method, the plating resist needs to be formed to be relatively thick in order to form the coil to be relatively thick. However, as the thickness of the plating resist is increased, an exposure limit may be reached whereby exposure of a lower portion of the plating resist is not smoothly performed. As such, it may be difficult to increase the thickness of the coil in examples in which the coil conductor is formed using the pattern plating method.

Further, in order to allow a thick plating resist to maintain its shape, the plating resist generally needs to have a width equal to or more than a predetermined width. However, since the width of the plating resist directly affects the interval between adjacent coils after removing the plating resist, the interval between the adjacent coils may be increased, such that there is a limitation in improving direct current resistance (Rdc) and inductance (Ls) characteristics.

Meanwhile, in order to overcome exposure limitations resulting from a thickness of a resist film, a method of forming a first plating conductor pattern after forming a first resist pattern by exposure and development and forming a second plating conductor pattern after forming a second resist pattern on the first resist pattern by exposure and development again has been proposed.

However, in examples in which an internal coil part is formed using only the pattern plating method, there is a limitation in increasing a cross-sectional area of the internal coil part, and an interval between adjacent coils is increased, such that there is a limitation in improving direct current resistance (Rdc) and inductance (Ls) characteristics.

Therefore, according to the exemplary embodiments disclosed herein, a coil conductor capable of having a high aspect ratio (AR), having an increased cross-sectional area, and preventing short-circuits from occurring between adjacent coils while forming an interval between adjacent coils to be narrow, may be implemented. The coil conductor may be implemented by forming at least two layers of a seed pattern, forming a surface coating layer covering the seed pattern, and further forming an upper plating layer on an upper surface of the surface coating layer.

Specific structures and a manufacturing method of the first and second coil conductors 41 and 42 according to the exemplary embodiment will be described below.

Figure 2:
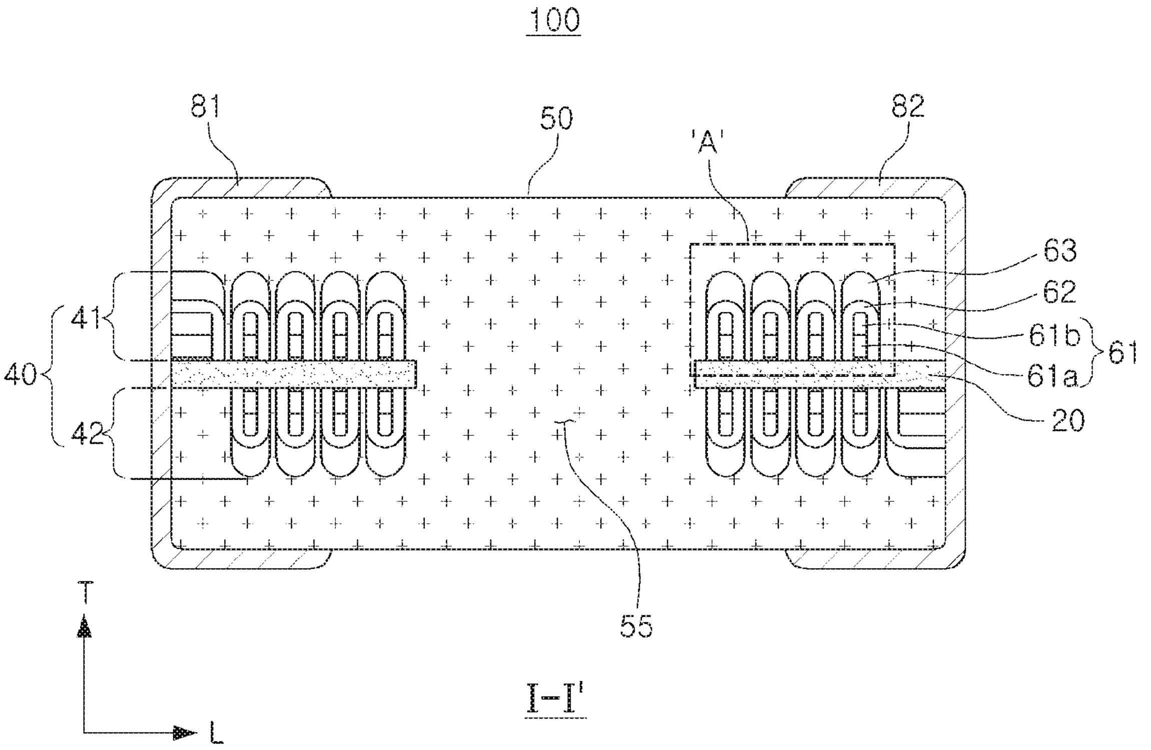
FIG. 2 is a cross-sectional view taken along line I-I' of FIG. 1.

FIG. 2 is a cross-sectional view taken along line I-I' of FIG. 1.

Referring to FIG. 2, the first and second coil conductors 41 and 42 may each include a first seed pattern 61*a* formed on the insulating substrate 20, a second seed pattern 61*b* formed on an upper surface of the first seed pattern 61*a*, a surface coating layer 62 covering and fully enclosing the first and second seed patterns 61*a* and 61*b*, and an upper plating layer 63 formed on an upper surface of the surface coating layer 62.

One end portion of the first coil conductor 41 formed on one surface of the insulating substrate 20 may be exposed to one end surface of the magnetic body 50 in the length (L) direction thereof, and one end portion of the second coil conductor 42 formed on the other surface of the insulating substrate 20 may be exposed to the other end surface of the magnetic body 50 in the length (L) direction thereof.

However, end portions of each of the first and second coil conductors 41 and 42 are not necessarily limited to being exposed as described above, but may each generally be exposed to at least one surface of the magnetic body 50.

The first and second external electrodes 81 and 82 may be formed on the external surfaces of the magnetic body 50 to be connected, respectively, to the end portions of first and second coil conductors 41 and 42 exposed to the end surfaces of the magnetic body 50.

Figure 3:
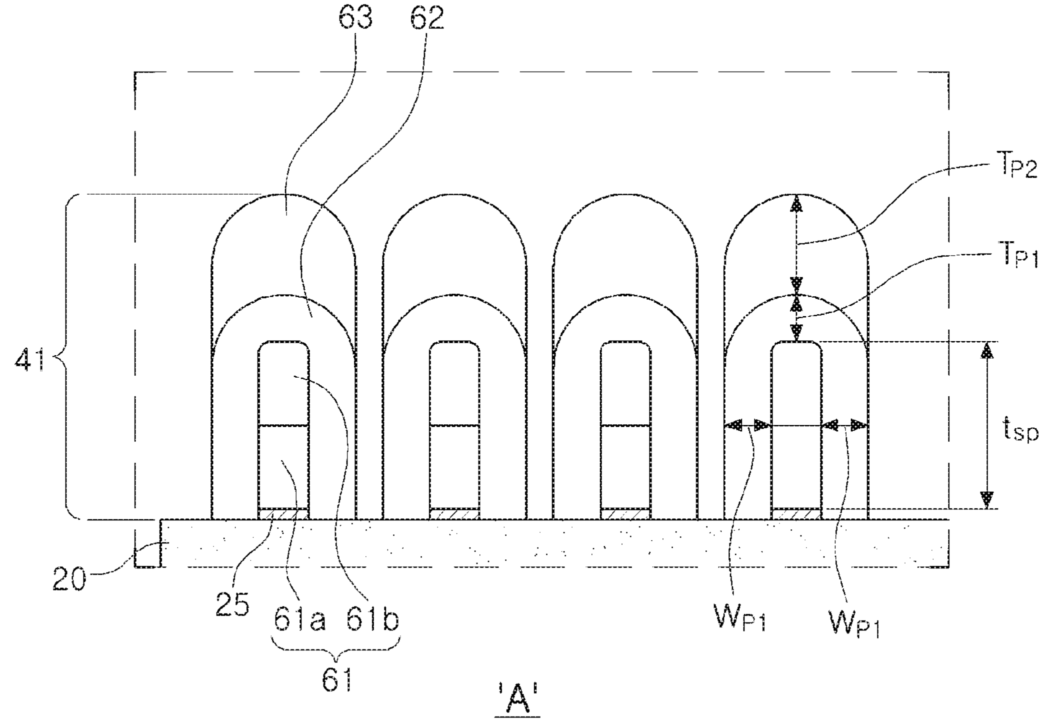
FIG. 3 is an enlarged schematic view of one illustrative example of part 'A' of FIG. 2.

FIG. 3 is an enlarged schematic view of part 'A' of FIG. 2.

Referring to FIG. 3, a seed pattern 61 according to the exemplary embodiment in the present disclosure may include the first seed pattern 61*a* and the second seed pattern 61*b* formed on the upper surface of the first seed pattern 61*a*. In addition, the surface coating layer 62 may cover (and, optionally, fully enclose) the seed pattern 61, and the upper plating layer 63 may be further formed on the upper surface of the surface coating layer 62.

The seed pattern 61 may be formed by a pattern plating method of forming a plating resist pattern using an exposure and development method on the insulation substrate 20 and filling an opening by plating.

The seed pattern 61 according to the exemplary embodiment may be formed of at least two layers including the first and second seed patterns 61*a* and 61*b*.

Although a case in which the seed pattern 61 is formed of two layers including the first and second seed patterns 61*a* and 61*b* is illustrated in FIG. 3, the number of layers of the seed pattern 61 is not limited thereto. The seed pattern 61 may be formed of three layers or more.

The seed pattern 61 may be formed to have an overall thickness $t_{SP}$ of 100 μm or more.

The exposure limitation (which depends on the thickness of the plating resist) may be overcome by the layering of the multiple seed patterns (61*a*, 61*b*), and the overall thickness $t_{SP}$ of the seed pattern 61 may be implemented to be 100 μm or more by forming the seed pattern 61 to have a structure composed of at least two layers. As the seed pattern 61 is formed to have an overall thickness $t_{SP}$ of 100 μm or more, a thickness of the coil conductors 41 and 42 (e.g., a dimension of the coil conductors 41 and 42 in the thickness direction 'T') may be increased, and the coil conductors 41 and 42 having a high aspect ratio (AR) may be implemented.

A cross-sectional shape of the seed pattern 61 in the thickness (T) direction may be a rectangle.

The seed pattern 61 may be formed by the pattern plating as described above, and thus, the cross-sectional shape thereof may be rectangular (or substantially rectangular, as shown in FIG. 3).

Each of the first and second coil conductors 41 and 42 may include a thin film conductor layer 25 disposed on a lower seed pattern surface 61 (e.g., disposed between the substrate 20 and the seed pattern 61).

The thin film conductor layer 25 may be formed by performing an electroless plating method or sputtering method on the insulating substrate 20 and performing etching.

The seed pattern 61 may be formed by performing electroplating on the thin film conductor layer 25 used as a seed layer.

The surface coating layer 62 covering the seed pattern 61 may be formed by performing electroplating on the seed pattern 61 used as a seed layer.

The surface coating layer 62 covering the seed pattern 61 may be formed, thereby solving a problem that it is difficult to decrease the interval between adjacent coils of the coil conductors 41 and 42 due to a limitation in decreasing the width of the plating resist at the time of forming only the seed pattern using the pattern plating method. In addition, the cross-sectional area of the coil conductor may be further increased by the surface coating layer 62, thereby improving direct current resistance (Rdc) and inductance (Ls) characteristics.

In the surface coating layer 62 according to the exemplary embodiment, as illustrated in FIG. 3, a growth degree $W_{P1}$ in the width direction and a growth degree $T_{P1}$ in the thickness direction may be similar to each other.

As described above, the surface coating layer 62 covering the seed pattern 61 may be formed of an isotropic plating layer of which the growth degree $W_{P1}$ in the width direction and the growth degree $T_{P1}$ in the thickness direction may be similar to each other. Further, the coil conductor may have a uniform thickness and a difference in thickness between adjacent coils may be decreased, whereby direct current resistance (Rdc) distribution may be decreased.

Further, the surface coating layer 62 may be formed of the isotropic plating layer, such that the first and second coil conductors 41 and 42 may not be bent but be straightly formed, thereby preventing short-circuits between adjacent coils and preventing defects in which an insulating film is not formed in portions of the first and second coil conductors 41 and 42.

Although an example in which the surface coating layer 62 is formed of a single layer is illustrated in FIG. 3, the surface coating layer 62 is not limited thereto. That is, the surface coating layer 62 may be formed of at least two or more layers.

The upper plating layer 63 formed on the upper surface of the surface coating layer 62 may be formed by performing electroplating.

The cross-sectional area of the coil conductor may be further increased by further forming the upper plating layer 63 on the surface coating layer 62, whereby direct current resistance (Rdc) and inductance (Ls) characteristics may be further improved.

In the upper plating layer 63 according to the exemplary embodiment illustrated in FIG. 3, growth in the width direction may be suppressed, and a growth degree $T_{P2}$ in the thickness direction may be significantly high.

The upper plating layer 63 formed on the surface coating layer 62 may be formed of an anisotropic plating layer of which the growth in the width direction is suppressed and the growth degree $T_{P2}$ in the thickness direction is significantly high, thereby further increasing the cross-sectional area of the coil conductor while preventing short-circuits between adjacent coils.

The upper plating layer 63, the anisotropic plating layer, may be formed on the upper surface of the surface coating layer 62, and may not cover all side surfaces of the surface coating layer 62.

An aspect ratio (AR) of the first and second coil conductors 41 and 42 according to the exemplary embodiment may be 3.0 or more. The AR may be measured as a ratio of a total thickness (e.g., a maximum thickness equal to the sum of $t_{SP}$, $T_{P1}$, and $T_{P2}$, or an average thickness) to a total width (e.g., a maximum width, or an average width) of one winding of the coil conductors 41 and 42.

Figure 4:
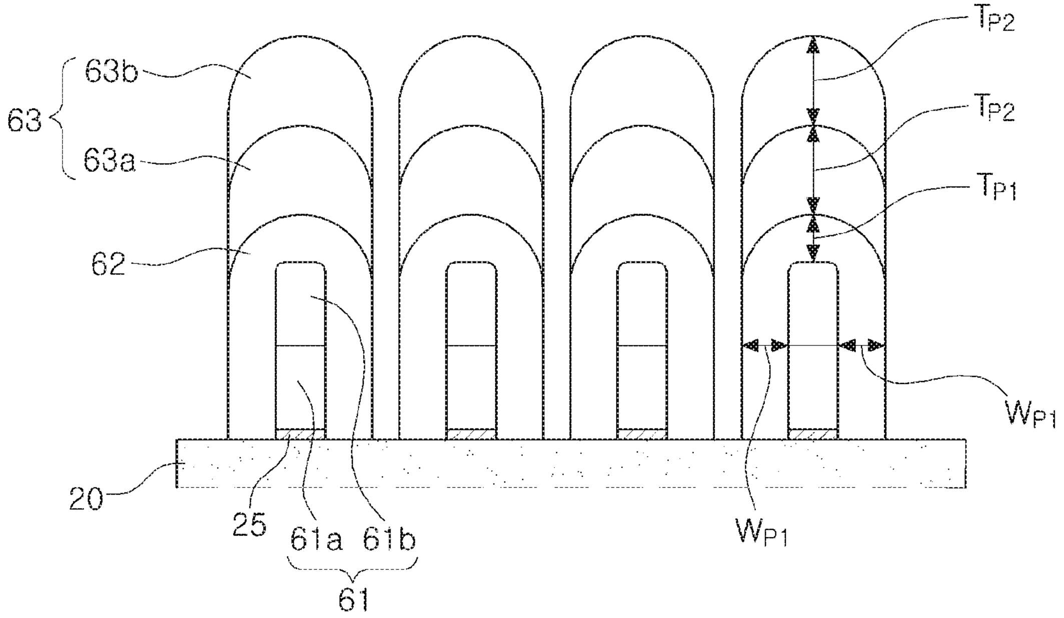
FIG. 4 is an enlarged schematic view of another illustrative example of part 'A' of FIG. 2.

FIG. 4 is an enlarged schematic view of another embodiment of part 'A' of FIG. 2.

Referring to FIG. 4, an upper plating layer 63 according to another exemplary embodiment in the present disclosure may include a first upper plating layer **63*a* formed on the upper surface of the surface coating layer 62 and a second upper plating layer 63*b* formed on an upper surface of the first upper plating layer 63*a***.

The first and second upper plating layers **63*a* and 63*b* may be anisotropic plating layers having growth in the width direction that is suppressed and having a growth degree ($T_{P2}$) in the thickness direction the is significantly high, similarly to the above-mentioned embodiment illustrated in FIG. 3. In the example, the upper plating layer 63 may thus be formed of two anisotropic plating layers 63*a* and 63*b***.

As described above, the cross-sectional area of the coil conductor may be further increased by forming the upper plating layer 63 (e.g., the anisotropic plating layer) to be composed of at least two layers **63*a* and 63*b***, whereby direct current resistance (Rdc) and inductance (Ls) characteristics may be improved.

Although an example in which the upper plating layer 63 is formed of two layers is illustrated in FIG. 4, the upper plating layer 63 is not limited thereto. That is, the upper plating layer 63 may more generally be formed of at least two or more layers.

Method of Manufacturing a Multilayer Seed Pattern Inductor

FIGS. 5A through 5H are diagrams illustrating sequential steps of a method of manufacturing a multilayer seed pattern inductor according to an exemplary embodiment in the present disclosure.

Figure 5A:
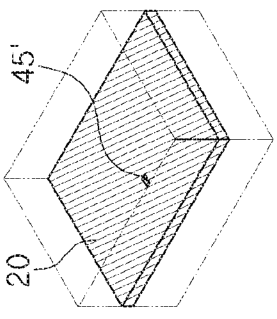
FIGS. 5A through 5H are diagrams illustrating sequential steps of a method of manufacturing a multilayer seed pattern inductor according to an exemplary embodiment.

Referring to FIG. 5A, an insulating substrate 20 may be prepared, and a via hole 45' may be formed in the insulating substrate 20.

The via hole 45' may be formed using a mechanical drill or a laser drill, but the formation method of the via hole 45' is not limited thereto.

The laser drill may be, for example, a $CO_2$ laser drill or YAG laser drill.

Figure 5B:
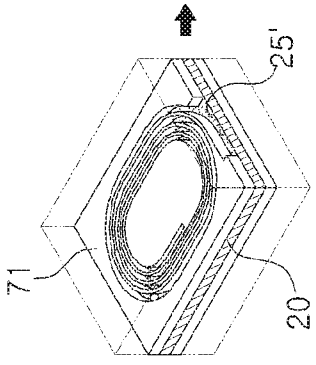

Referring FIG. 5B, a thin film conductor layer 25' may be entirely formed on upper and lower surfaces of the insulating substrate 20, and a plating resist 71 having an opening for forming a seed pattern may be formed.

As the plating resist 71, a general photosensitive resist film, a dry film resist, or the like, may be used, but the plating resist 71 is not limited thereto.

After the plating resist 71 is applied, the opening for forming a seed pattern may be formed by an exposure and development method.

Figure 5C:
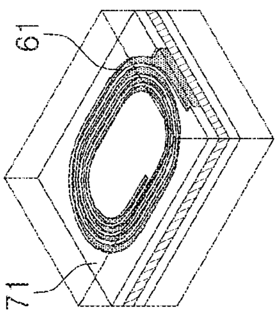

Referring to FIG. 5C, the opening for forming a seed pattern may be filled with a conductive metal by plating, thereby forming a seed pattern 61.

The opening for forming a seed pattern may be filled with the conductive metal by electroplating using the thin film conductor layer 25' as a seed layer, such that the seed pattern 61 may be formed, and the via hole 45' may be filled with the conductive metal by electroplating, thereby forming a via (not illustrated).

In this case, according to the exemplary embodiment, the seed pattern 61 may be formed of at least two layers, such that coil conductors 41 and 42 may have a high aspect ratio (AR). A detailed description of a manufacturing method thereof will be described below.

Figure 5D:
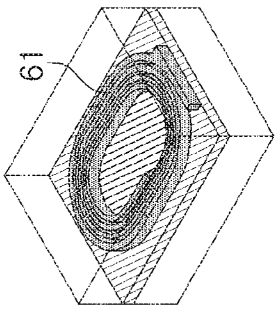

Referring to FIG. 5D, the plating resist 71 may be removed, and the thin film conductor layer 25' may be etched, such that a thin film conductor layer 25 may only remain below a lower seed pattern surface 61.

Figure 5E:
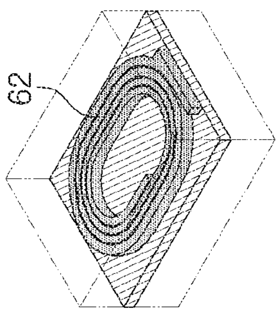

Referring to FIG. 5E, a surface coating layer 62 covering the seed pattern 61 may be formed, and an upper plating layer 63 may be formed on an upper surface of the surface coating layer 62.

The surface coating layer 62 and the upper plating layer 63 may be formed by electroplating.

Figure 5F:
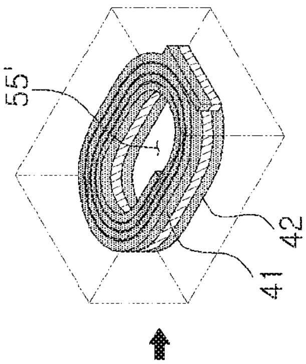

Referring to FIG. 5F, portions of the insulating substrate 20, other than regions of the insulating substrate 20 on which are disposed the first and second coil conductors 41 and 42 each including the seed pattern 61, the surface coating layer 62, and the upper plating layer 63, may be removed. A central portion of the insulating substrate 20 may be removed, and thus a core part hole 55' may be formed.

The insulating substrate 20 may be removed by performing mechanical drilling, laser drilling, sand blasting, punching, or the like.

Figure 5G:
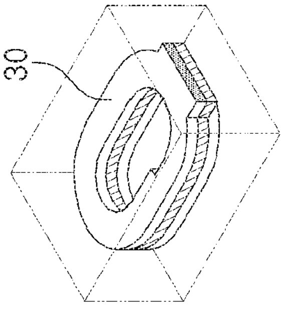

Referring to FIG. 5G, an insulating film 30 covering each of the first and second coil conductors 41 and 42 may be formed.

The insulating film 30 may be formed by a method known in the art such as a screen printing method, an exposure and development method of a photo resist (PR), a spray application method, or the like. The insulating film 30 may be formed so as to extend into crevices between adjacent windings of the first and second coil conductors 41 and 42.

Figure 5H:
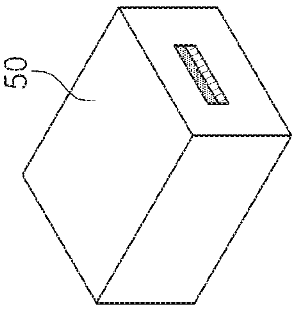

Referring to FIG. 5H, a magnetic body 50 may be formed by stacking magnetic sheets on upper and lower surfaces of the first and second coil conductors 41 and 42, and compressing and curing the stacked magnetic sheets.

In this case, the core part hole 55' may be filled with a magnetic material, thereby forming a core part 55.

Next, first and second external electrodes 81 and 82 may be formed on external surfaces of the magnetic body 50 to be respectively connected to end portions of the first and second coil conductors 41 and 42 exposed to end surfaces of the magnetic body 50.

FIGS. 6A through 6F are diagrams illustrating sequential steps of a method for forming the seed pattern according to an exemplary embodiment in the present disclosure.

Figure 6A:
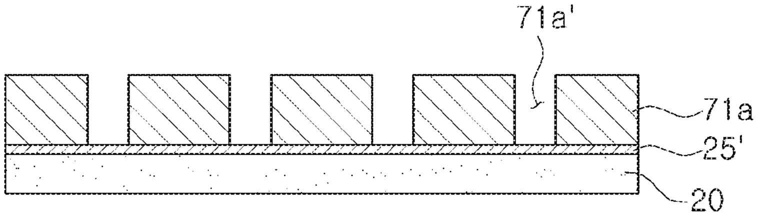
FIGS. 6A through 6F are diagrams illustrating sequential steps of a method for forming a seed pattern according to an exemplary embodiment.

Referring to FIG. 6A, a first plating resist 71*a* having an opening 71*a'* for forming a first seed pattern may be formed on an insulating substrate 20 on which a thin film conductor layer 25' is formed to cover an entirety of the surface of the insulating substrate 20.

After the first plating resist 71*a* is applied, the opening 71*a'* for forming a first seed pattern may be formed by an exposure and development method.

A thickness of the first plating resist 71*a* may be 40 μm to 60 μm.

Figure 6B:
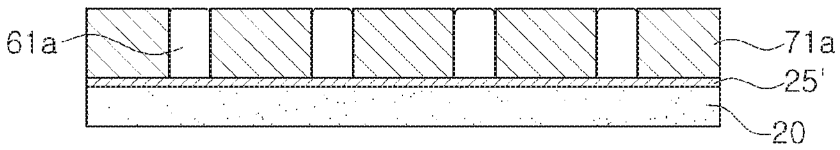

Referring to FIG. 6B, a first seed pattern 61*a* may be formed by filling the opening 71*a'* for forming a first seed pattern with a conductive metal using a plating method.

Figure 6C:
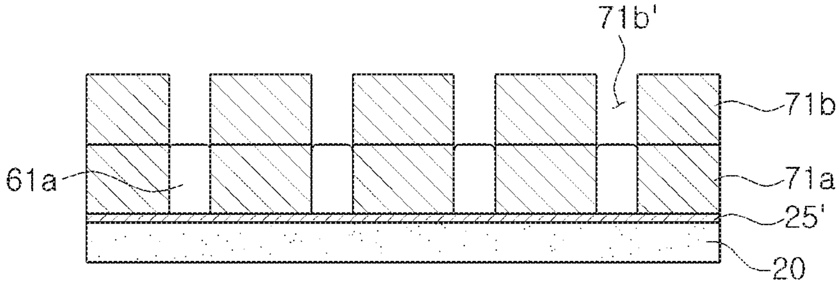

Referring to FIG. 6C, a second plating resist 71*b* having an opening 71*b'* for forming a second seed pattern may be formed on the first plating resist 71*a*.

After the second plating resist 71*b* is applied to the first plating resist 71*a* and the first seed pattern 61*a*, the opening 71*b'* for forming a second seed pattern exposing the first seed pattern 61*a* may be formed by an exposure and development method.

A thickness of the second plating resist 71*b* may be 40 μm to 60 μm.

Figure 6D:
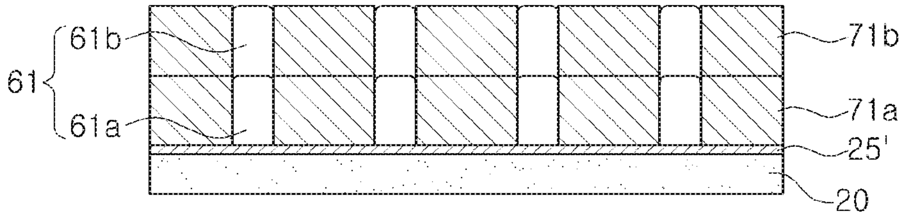

Referring to FIG. 6D, a second seed pattern 61*b* may be formed on an upper surface of the first seed pattern 61*a* by filling the opening 71*b'* for forming a second seed pattern with a conductive metal using a plating method.

Figure 6E:
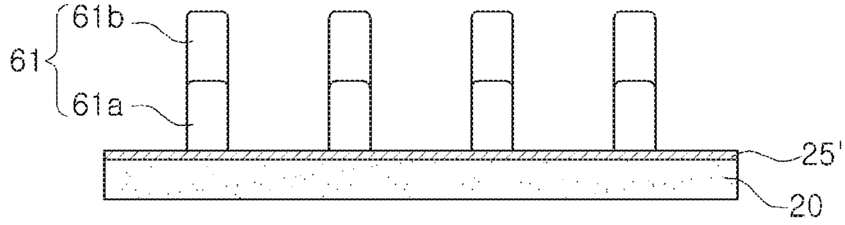

Referring to FIG. 6E, the first and second plating resists 71*a* and 71*b* may be removed.

Figure 6F:
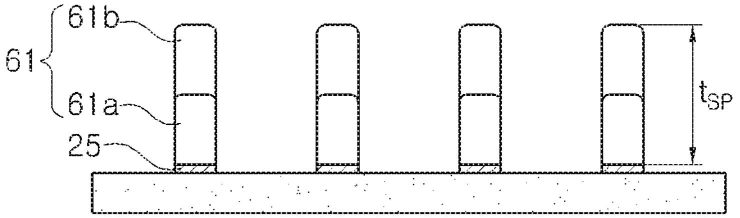

Referring to FIG. 6F, the thin film conductor layer 25' may be etched, such that a thin film conductor layer 25 may remain only below a lower surface of the first seed pattern 61*a*.

A seed pattern 61 formed as described above may have a structure composed of two layers.

A cross-sectional shape of the seed pattern 61 in the thickness (T) direction may be a rectangle, and an overall thickness $t_{SP}$ of the seed pattern 61 may be 100 μm or more.

Meanwhile, although a formation method of only the first and second seed patterns 61*a* and 61*b* is illustrated in FIGS. 6A through 6F, the formation method of the seed pattern is not limited thereto. That is, a seed pattern having a structure composed of at least two or more layers, including at least one internal interface between adjacent layers may be formed by repeatedly performing the methods of FIGS. 6C and 6D described above.

Meanwhile, a formation method of a seed pattern having a structure composed of at least two layers is not necessarily limited to the formation method of FIGS. 6A through 6F, but the seed pattern having a structure composed of at least two layers may also be formed by performing plating at least two times or more after forming a plating resist to be thicker.

Figure 7:
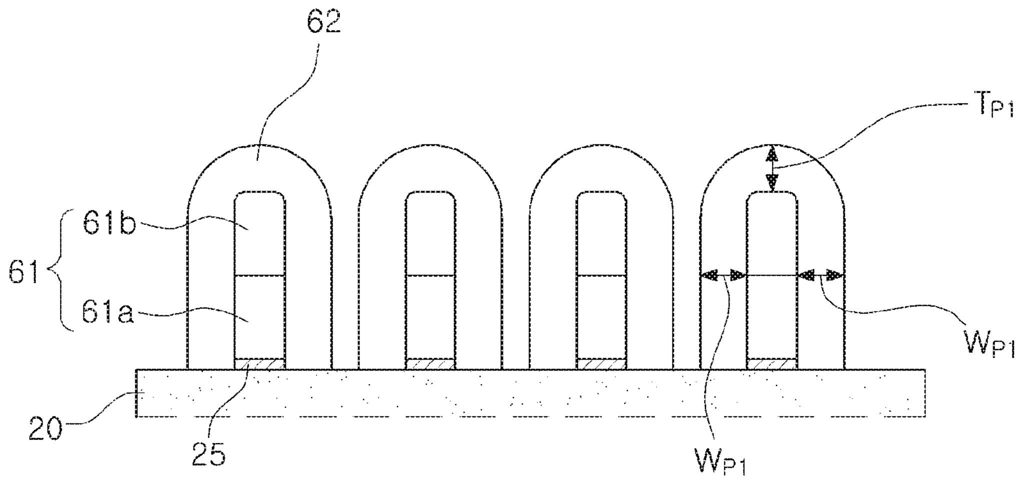
FIG. 7 is a view illustrating a formation method of a surface coating layer according to an exemplary embodiment.

FIG. 7 is a view illustrating a formation method of the surface coating layer 62 according to an exemplary embodiment in the present disclosure.

Referring to FIG. 7, the surface coating layer 62 covering the seed pattern 61 may be formed by performing electroplating on the seed pattern 61.

In this case, the surface coating layer 62 according to the exemplary embodiment may be formed of an isotropic plating layer of which a growth degree $W_{P1}$ in the width direction and a growth degree $T_{P1}$ in the thickness direction are similar to each other as illustrated in FIG. 7 by adjusting a current density, a concentration of a plating solution, a plating rate, or the like, at the time of electroplating.

As described above, the surface coating layer 62 covering the seed pattern 61 may be formed of the isotropic plating layer of which the growth degree $W_{P1}$ in the width direction and the growth degree $T_{P1}$ in the thickness direction are similar to each other, and thus the coil conductor may have a uniform thickness. The method of forming the surface coating layer 62 may decrease a difference in thickness between adjacent coils, whereby direct current resistance (Rdc) distribution may be decreased.

Further, the surface coating layer 62 may be formed of the isotropic plating layer, such that the first and second coil conductors 41 and 42 may not be bent but be straightly formed, thereby preventing short-circuits between adjacent coils and preventing defects in which an insulating film 30 is not formed in portions of the first and second coil conductors 41 and 42. Note that the thickness $W_{P1}$ may be selected so as to ensure that the surface coating layer 62 of one winding does not contact the surface coating layer 62 of an adjacent winding of the coil conductors 41 and 42, and such that an air gap remains between the adjacent windings.

Figure 8:
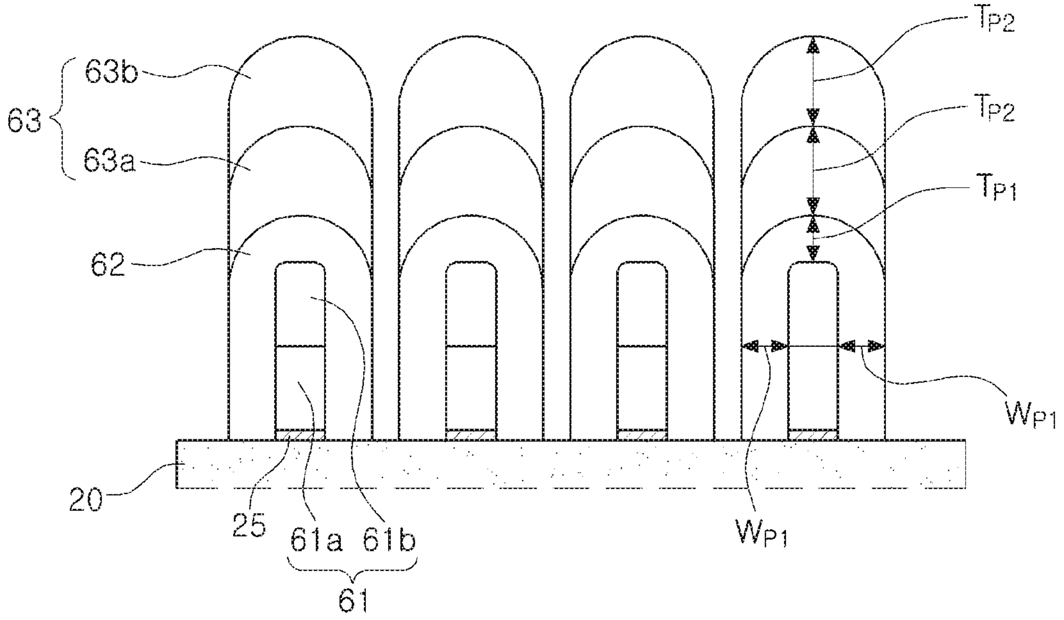
FIG. 8 is a view illustrating a formation method of an upper plating layer according to an exemplary embodiment.

FIG. 8 is a view illustrating a formation method of an upper plating layer according to an exemplary embodiment in the present disclosure.

Referring to FIG. 8, an upper plating layer 63 may be further formed by performing electroplating on the surface coating layer 62.

In this case, the upper plating layer 63 according to the exemplary embodiment may be formed of an anisotropic plating layer of which growth in the width direction is suppressed, and a growth degree $T_{P2}$ in the thickness direction is significantly high as illustrated in FIG. 8 by adjusting a current density, a concentration of a plating solution, a plating rate, or the like, at the time of electroplating.

The upper plating layer 63 may be formed of two layers by forming a first upper plating layer 63*a* on an upper surface of the surface coating layer 62 and forming a second upper plating layer 63*b* on an upper surface of the first upper plating layer 63*a*.

The cross-sectional area of the coil conductor may be further increased by forming the upper plating layer 63, the anisotropic plating layer, to be composed of at least two or more layers as described above, whereby direct current resistance (Rdc) and inductance (Ls) characteristics may be improved.

Except for the description described above, a description of features overlapped with those of the multilayer seed pattern inductor according to the exemplary embodiment in the present disclosure described above will be omitted.

As set forth above, according to the exemplary embodiments presented herein, the cross-sectional area of the internal coil part may be increased, and direct current resistance (Rdc) characteristics may be improved.

While exemplary embodiments have been shown and described above, it will be apparent to those skilled in the art that modifications and variations could be made without departing from the scope of the present invention as defined by the appended claims.

What is claimed is:

1. A multilayer seed pattern inductor comprising:
a magnetic body containing a magnetic material; and
an internal coil part embedded in the magnetic body and including connected coil conductors disposed on two opposing surfaces of an insulating substrate,
wherein each of the coil conductors includes a seed pattern including first and second seed pattern layers, a surface coating layer covering the seed pattern, and an upper plating layer disposed on an upper surface of the surface coating layer,
wherein the seed pattern has a height greater than a width thereof, wherein the width is measured along one of the opposing surfaces of the insulating substrate, and
wherein the first seed pattern layer has the surface coating layer contacting only side surfaces thereof from among top, bottom, and side surfaces, and the second seed pattern layer has the surface coating layer covering upper and side surfaces thereof.

2. The multilayer seed pattern inductor of claim 1, wherein the upper plating layer includes a first upper plating layer disposed on the upper surface of the surface coating layer and a second upper plating layer disposed on an upper surface of the first upper plating layer.

3. The multilayer seed pattern inductor of claim 1, wherein the second seed pattern layer covers the upper surface of the first seed pattern layer, and the seed pattern has an overall thickness of 100 μm or more.

4. The multilayer seed pattern inductor of claim 1, wherein the seed pattern has a substantially rectangular cross-sectional shape.

5. The multilayer seed pattern inductor of claim 1, wherein the surface coating layer extends in width and thickness directions to cover upper and side surfaces of the seed pattern.

6. The multilayer seed pattern inductor of claim 1, wherein the upper plating layer extends only on the upper surface of the surface coating layer, among upper and side surfaces of the surface coating layer, in a thickness direction only.

7. The multilayer seed pattern inductor of claim 1, wherein the surface coating layer is an isotropic plating layer.

8. The multilayer seed pattern inductor of claim 1, wherein the upper plating layer is an anisotropic plating layer.

9. The multilayer seed pattern inductor of claim 1, wherein a thin film conductor layer is disposed between a lower seed pattern surface and the insulating substrate.

10. The multilayer seed pattern inductor of claim 1, wherein the magnetic body includes a magnetic metal powder and a thermosetting resin.

11. The multilayer seed pattern inductor of claim 1, wherein the seed pattern and surface coating layer jointly extend to a height greater than a width thereof measured along one of the opposing surfaces of the insulating substrate.

12. A multilayer base pattern inductor comprising:
a magnetic body containing a magnetic material; and
an internal coil part embedded in the magnetic body and including connected coil conductors disposed on two opposing surfaces of an insulating substrate,
wherein each of the coil conductors includes a base pattern including first and second seed pattern layers, a surface coating layer covering the base pattern, and an outer plating layer disposed on an outer surface of the surface coating layer facing away from the insulating substrate,
wherein the outer plating layer extends only on an upper surface facing away from the insulating substrate, among upper and side surfaces of the surface coating layer of each of the coil conductors,
wherein the first seed pattern layer has the surface coating layer contacting only side surfaces thereof from among top, bottom, and side surfaces, and the second seed pattern layer has the surface coating layer covering upper and side surfaces thereof, and wherein the base pattern has a height greater than a width thereof, wherein the width is measured along one of the opposing surfaces of the insulating substrate.

13. The multilayer base pattern inductor of claim 12, wherein each outer plating layer includes a first outer plating layer disposed on the outer surface of the surface coating layer and a second outer plating layer disposed on an outer surface of the first outer plating layer.

14. The multilayer base pattern inductor of claim 12, wherein the base pattern has an overall thickness of 100 μm or more.

15. The multilayer base pattern inductor of claim 12, wherein the base pattern has a substantially rectangular cross-sectional shape.

16. The multilayer base pattern inductor of claim 12, wherein the surface coating layer extends in width and thickness directions to cover outer and side surfaces of the base pattern.

17. The multilayer base pattern inductor of claim 12, wherein side surfaces of the surface coating layer are free of the outer plating layer.

18. The multilayer base pattern inductor of claim 12, wherein the surface coating layer is an isotropic plating layer.

19. The multilayer base pattern inductor of claim 12, wherein the outer plating layer is an anisotropic plating layer.

20. The multilayer base pattern inductor of claim 12, wherein a thin film conductor layer is disposed between a lower base pattern surface and the insulating substrate.

21. The multilayer base pattern inductor of claim 12, wherein the magnetic body includes a magnetic metal powder and a thermosetting resin.

22. The multilayer base pattern inductor of claim 12, wherein the base pattern and surface coating layer jointly extend to a height greater than a width thereof measured along one of the opposing surfaces of the insulating substrate.

* * * * *